(12) United States Patent
Chandhok et al.

(10) Patent No.: US 6,982,133 B2
(45) Date of Patent: Jan. 3, 2006

(54) DAMAGE-RESISTANT COATINGS FOR EUV LITHOGRAPHY COMPONENTS

(75) Inventors: Manish Chandhok, Beaverton, OR (US); Kramadhati V. Ravi, Atherton, CA (US)

(73) Assignee: Intel Corporation, Santa Clara, CA (US)

(*) Notice: Subject to any disclaimer, the term of this patent is extended or adjusted under 35 U.S.C. 154(b) by 175 days.

(21) Appl. No.: 10/327,599

(22) Filed: Dec. 21, 2002

(65) Prior Publication Data
US 2004/0121243 A1 Jun. 24, 2004

(51) Int. Cl.
*G01F 9/00* (2006.01)

(52) U.S. Cl. .......................................... 430/5
(58) Field of Classification Search ............ 430/5, 430/513; 250/492.2; 378/35; 427/595
See application file for complete search history.

(56) References Cited

U.S. PATENT DOCUMENTS

| | | | | |
|---|---|---|---|---|
| 5,304,461 A | * | 4/1994 | Inoue et al. | 430/323 |
| 6,673,684 B1 | * | 1/2004 | Huang et al. | 438/299 |
| 6,724,462 B1 | * | 4/2004 | Singh et al. | 355/53 |
| 2004/0033699 A1 | * | 2/2004 | Hector et al. | 438/763 |

* cited by examiner

*Primary Examiner*—S. Rosasco
(74) *Attorney, Agent, or Firm*—Schwabe, Williamson & Wyatt, P.C.

(57) ABSTRACT

Damage-resistant coatings are provided on radiation-exposed surfaces of EUV lithographic components. The diamond coating provides resistance to particle impingement, cleaning processes, and degradation due to high temperatures. The diamond coating is beneficial when deposited on the reflecting surface of an EUV Si/Mo multilayer mirror, grazing collector incidence mirror, the reflecting surface of an EUV Si/Mo multilayer reflective mask, and radiation-exposed surfaces of EUV debris shield. The diamond coating provides longer lasting EUV components.

21 Claims, 2 Drawing Sheets

| No | Material | Thermal conductivity (W/cm-K) | Linear Thermal Expansion coeff. ($\times 10^{-6}/°K$) | Max. temperature (°C) |
|---|---|---|---|---|
| 1 | CVD diamond | 10-20 | 0.8-1.5 | ~4000 |
| 2 | Mo | 1.39 | 4.8 | 2623 |
| 3 | Si | 1.5 | 2.6 | 1414 |
| 4 | Cr | 0.94 | 4.9 | 1907 |
| 5 | Ta | 0.57 | 6.3 | 3017 |

| No | Material | Thermal conductivity (W/cm-K) | Linear Thermal Expansion coeff. ($\times 10^{-6}$/°K) | Max. temperature (°C) |
|---|---|---|---|---|
| 1 | CVD diamond | 10-20 | 0.8-1.5 | ~4000 |
| 2 | Mo | 1.39 | 4.8 | 2623 |
| 3 | Si | 1.5 | 2.6 | 1414 |
| 4 | Cr | 0.94 | 4.9 | 1907 |
| 5 | Ta | 0.57 | 6.3 | 3017 |

DAMAGE-RESISTANT COATINGS FOR EUV LITHOGRAPHY COMPONENTS

FIELD OF THE INVENTION

The present invention relates to extreme ultraviolet (EUV) lithography, and more particularly, to damage resistant coatings for EUV lithography components.

BACKGROUND OF INVENTION

Extreme ultraviolet lithography, which uses a source at 13.5 nm wavelength, is a promising technology for 0.032 micron integrated circuit (IC) fabrication. Since the absorption at that wavelength is very strong in all materials, EUV lithography employs Si/Mo multilayer mirrors as reflective optics, rather than refractive optics used in longer wavelength (optical) lithography. The strong absorption requires the use of reflective mask reticles, rather than through-the-mask reticles used in longer wavelength lithography. The Si/Mo multilayer reflective masks are made by depositing highly detailed absorber patterns on top of the Si/Mo multilayer mirrors.

There are many issues to be resolved in order to realize EUV lithography, such as, developing a powerful EUV source, robust components that direct the radiation (mirrors), and robust components that define the integrated circuit features (reticles). An EUV source with a collectable radiation power of 50 W to 150 W at over 5 kHz in the spectral range of 13–14 nm is required to achieve requirements for high volume manufacturing of 300 mm wafers. Laser-induced and electrical discharge gas plasma devices (EUV lamps) are under investigation as promising EUV sources. These sources generate EUV radiation by heating certain materials into a plasma to such a level, in the many 100,000's C, that the material emits EUV radiation. Potential source materials which emit EUV radiation at excited energy levels include xenon, oxygen, and lithium.

Not withstanding the reflectivity of the Si/Mo multilayer mirrors and reflective masks, they remain subject to tremendous heat loads from absorption of the EUV radiation. The reflectivity of the mirrors and reflective masks degrades over time requiring periodic replacement. Improvements to increase the lifetime of the mirrors and reflective masks is desired.

Along with the radiation, the EUV sources are also emitters of high velocity particulate contamination. The high velocity particles are a potential source of harmful erosion of surfaces upon which they impinge, as well as a contamination source, as they deposit onto the reflective surfaces of the components upon which they reflect. The Si/Mo multilayer mirrors and reflective masks are highly sensitive to this erosion and particle contamination.

Optical lithography incorporates the use of pellicles to protect the reticle from contamination. A pellicle can not be used with EUV lithography due to the high heating of the pellicle from EUV absorption.

Debris shields are being investigated, through which the EUV radiation is passed to catch or filter the particles. But in the effort to maximize photon illumination, the "mesh" size has to be a compromise between particle pass-through rate and reduction in EUV power.

Until a more effective process is used to prevent particulate contamination, frequent cleaning of the Si/Mo multilayer mirrors and reflective masks will be required. But the delicate multilayer coatings used in EUV mirrors and reticles cannot withstand harsh or frequent cleaning. The cleaning chemicals used in the reticle cleaning process for conventional binary masks cannot be used as they etch the delicate surfaces. Improvements are needed to permit thorough cleaning of the Si/Mo multilayer mirrors grazing collector incidence mirror, and reflective masks without damage.

In order for EUV lithography to meet commercial requirements and demands, including reliability, productivity, and maintenance, lifetime-extending improvements are necessary for the Si/Mo multilayer mirrors and reflective masks.

BRIEF DESCRIPTION OF DRAWINGS

FIG. 4 is a table of materials comparing diamond coating with mirror and reticle materials.

DESCRIPTION

In the following detailed description, reference is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

Figure 1:
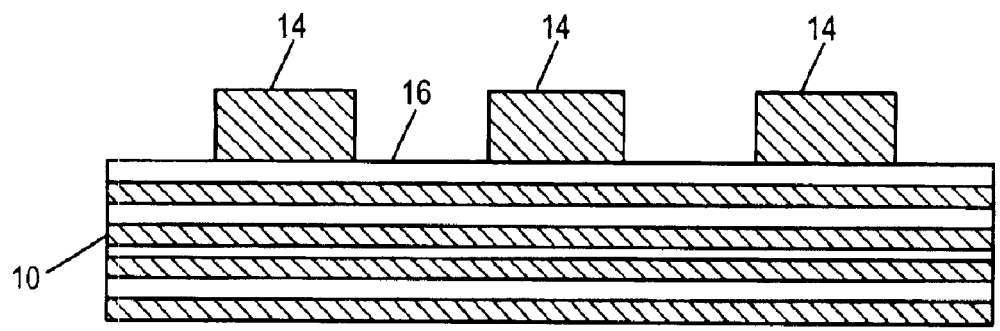
FIG. 1 is a cross-sectional view of an EUV reticle with an absorber pattern.
Figure 2:
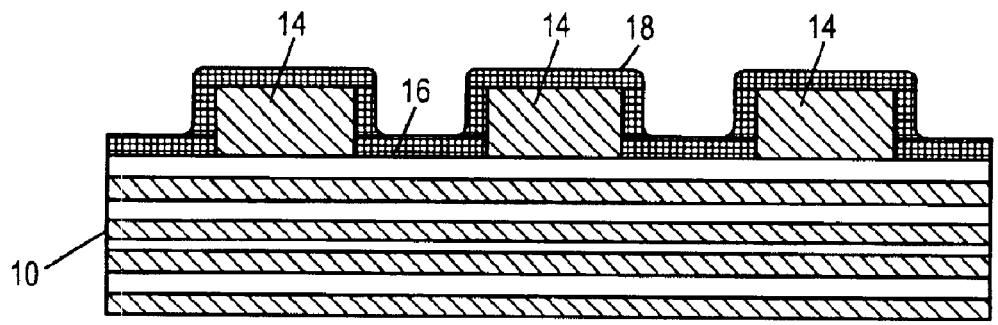
FIG. 2 is a cross-sectional view of an EUV reticle with a diamond coating on the reflective surface, in accordance with an embodiment of the present invention.
Figure 3:
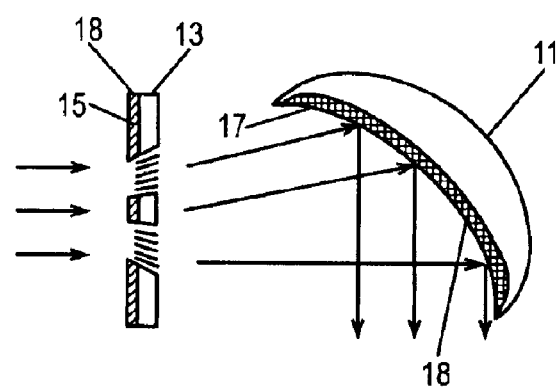
FIG. 3 is a side view of a Si/Mo multilayer collection mirror with a diamond coating on the reflective surface, in accordance with an embodiment of the present invention.

FIG. 1 is a cross-sectional view of a portion of an EUV reticle 10 with an absorber pattern 14. FIG. 2 is a cross-sectional view of the EUV reticle 10 of FIG. 1 wherein the reflective surface 16 has a diamond coating 18, in accordance with an embodiment of the present invention. FIG. 3 is a side view of a Si/Mo multilayer collection mirror 11 with a diamond coating 18 on the reflective surface 17, in accordance with an embodiment of the present invention In another embodiment of the EUV reticle 10, in accordance with the present invention, the diamond coating 18 is deposited onto the reflective surface 16 prior to the deposition of the absorber pattern 14. The diamond 18 serves a protective barrier for the reticle 10.

Diamond is extremely erosion resistant and one of the hardest substances known. In one embodiment in accordance with the present invention, a low temperature plasma enhanced chemical vapor deposition (CVD) process is used to deposit a thin ($\leq 10$ nm) diamond coating 18 on the Si/Mo multilayer mirrors 11 and reflective reticles 10 to serve as a protective barrier against erosion, heating and aggressive cleaning. Material properties of the diamond coating 18 and the Si/Mo multilayer mirrors 11 and reflective reticles is presented in FIG. 4.

The diamond coating 18 has a thickness on the order of 10 nm or less. The diamond coating adheres well to carbide-forming materials, such as, but not limited to, Si and Mo, without delamination and flaking despite differences in the coefficients of thermal expansion. Any potential for delamination can be overcome by matching the thermal expansion coefficients of the diamond film 18 and the component.

The diamond coating 18 can be applied on parts using plasma enhanced CVD techniques. In one embodiment in accordance with the invention, an Ar precursor is used in the CVD process as opposed to the conventional $H_2$ precursor in combination with a hydrocarbon gas such as CH4. Since the CVD plasma will heat the component, such as, but not limited to EUV mirrors, reflective reticles, and debris shields, the substrate requires active cooling during diamond deposition to maintain a component temperature below 300 C.

The theoretical EUV reflectivity of a Si/Mo multilayer mirror decreases by 10% with a 10 nm thick diamond coating 18. It is for this reason that the diamond coating 18 should be as thin as required for durability and protection. In some embodiments, not all of the mirrors in the radiation path would receive the diamond coating 18 as that would overly decrease the available power of the radiation.

Low temperature CVD diamond deposition techniques, with a deposition temperature of 300° C., are provided to reduce reflectivity loss of Si/Mo multilayer mirrors due to inter-diffusion during the deposition process. However, the addition of $B_4C$ or $B_6C$ inter-diffusion barriers between the Si/Mo multilayer increases the ability of the Si/Mo multilayer to withstand higher temperatures increases, up to 2 minutes at 250° C.

The diamond coating does not unduly hinder mask repair on the Si/Mo multilayer reflective masks. In one method in accordance with the present invention, the diamond coating is removed at predetermined locations by oxidizing the diamond coating at those locations using laser heating in an oxygen environment. The laser will heat the diamond coating causing it to oxidize, resulting in CO2 by-product. Consequently, removable of the diamond coating will not leave any residue on the reflective surface. Once the diamond coating is removed by selective oxidation, mask repair may be achieved. Following repair, a thin diamond coating is deposited on the repaired mask. In another embodiment in accordance with the present invention, the diamond coating is removed from the entire reflective mask reflective surface by low temperature oxidation of the diamond coating. Following diamond coating removal and mask repair, a thin diamond coating is deposited on the repaired mask.

In another embodiment in accordance with the present invention, a diamond coating is deposited onto the radiation facing surfaces of other components in the lithographic system. Referring again to FIG. 3, the radiation facing surface 15 of the debris shield 13 is coated with a diamond coating 18. The diamond coating 18 protects the radiation facing surface 15 from erosion by the fast moving particles.

In another embodiment, the diamond coating is applied on multi-player mirror optics, such as, but not limited to, collector mirror optics.

In another embodiment in accordance with the present invention, the diamond coating is applied to grazing collector mirror optics. The term grazing incidence applies to reflection angles of grater than 80 degrees from the perpendicular of the mirror surface. The temperature deposition process as the substrates for grazing incidence mirrors are commonly metallic, such as, but not limited to nickel, which are not as temperature sensitive as the multilayer coating required for normal incidence mirror.

The Si/Mo multilayer mirrors and reflective masks incorporating the diamond coatings, in accordance with the present invention, exhibit durability improvement to cleaning and handling which allows for more frequent and more aggressive cleanings to remove contaminating particles. Areas in contact with the reticle handling equipment, if coated with a diamond coating, will be more resistant to wear and tear due to the durability of the diamond coating.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A method for protecting a lithographic component from damage, comprising:
    depositing a diamond coating onto radiation-exposed surfaces of the component using a plasma-enhanced chemical vapor deposition process; and
    wherein said depositing is depositing a diamond coating onto the reflecting surfaces of a reflecting mask reticle.

2. The method of claim 1, wherein depositing a diamond coating onto the reflecting surfaces of a reflecting mask reticle comprises;
    depositing a diamond coating onto the reflecting surfaces of an extreme ultraviolet lithographic Si/Mo multilayer reflecting mask reticle.

3. The method of claim 1, wherein depositing a diamond coating onto radiation-exposed surfaces of the component comprises:
    depositing a diamond coating onto the reflecting surfaces of an extreme ultraviolet lithographic mirror.

4. The method of claim 3, wherein depositing a diamond coating onto radiation-exposed surfaces of the component comprises:
    depositing a diamond coating onto the reflecting surfaces of an extreme ultraviolet lithographic Si/Mo multilayer mirror.

5. The method of claim 1, wherein depositing a diamond coating onto radiation-exposed surfaces of the component comprises:
    depositing a diamond coating onto the radiation-exposed surfaces of an extreme ultraviolet lithographic debris shield.

6. The method of claim 1, further comprising removing the diamond coating by oxidizing the diamond coating, the removing further including:
    heating a predetermined portion of the diamond coating in an environment containing oxygen.

7. The method of claim 1, wherein comprising removing the diamond coating by oxidizing the diamond coating including:
    heating a predetermined portion of the diamond coating with a laser in an environment containing oxygen and oxidizing the predetermined portion of the diamond coating.

8. The method of claim 1, wherein using a plasma-enhanced chemical vapor deposition process comprises:
    using a plasma-enhanced chemical vapor deposition process with an Ar precursor at a temperature not exceeding 300 C.

9. The method of claim 1, wherein depositing a diamond coating onto radiation-exposed surfaces of the component comprises:

depositing a diamond coating onto radiation-exposed surfaces a Si/Mo multilayer component having $B_4C$ or $B_6C$ inter-diffusion barrier between the Si/Mo layers.

10. An extreme ultraviolet (EUV) lithographic component, comprising:

a substrate having a radiation-exposed surface; and a plasma-enhanced chemical vapor deposition diamond coating covering the radiation-exposed surface.

11. The EUV lithographic component of claim 10, wherein the substrate comprises:

a Si/Mo multilayer reflecting mask reticle comprising a reflecting mask, the diamond coating covering the reflecting mask.

12. The EUV lithographic component of claim 10, wherein the substrate comprises:

a Si/Mo multilayer mirror having a reflecting surface, the diamond coating covering the reflecting surface.

13. The EUV lithographic component of claim 10, wherein the substrate comprises:

an EUV debris shield, the diamond coating covering the radiation-exposed surfaces.

14. The EUV lithographic component of claim 1, further comprising:

an inter-diffusion barrier comprising $B_4C$ or $B_6C$ disposed between the Si/Mo layers.

15. The EUV lithographic component of claim 12, further comprising:

an inter-diffusion barrier comprising $B_4C$ or $B_6C$ disposed between the diamond coating and the Si/Mo multilayer mirror.

16. An EUV lithographic system, comprising:

an EUV lithographic component having a radiation-exposed surface; and a plasma-enhanced chemical vapor deposition diamond coating covering the radiation-exposed surface.

17. The EUV lithographic system of claim 16, wherein the component comprises:

a Si/Mo multilayer reflecting mask reticle comprising a reflecting mask, the diamond coating covering the reflecting mask.

18. The EUV lithographic system of claim 17, further comprising:

an inter-diffusion barrier comprising $B_4C$ or $B_6C$ disposed between the Si/Mo layers.

19. The EUV lithographic system of claim 16, wherein the component comprises:

a Si/Mo multilayer mirror having a reflecting surface, the diamond coating covering the reflecting surface.

20. The EUV lithographic system of claim 19, comprising:

an inter-diffusion barrier comprising $B_4C$ or $B_6C$ disposed between the Si/Mo layers.

21. The EUV lithographic system of claim 16, wherein the component comprises:

an EUV debris shield, the diamond coating covering the radiation-exposed surfaces.

* * * * *

UNITED STATES PATENT AND TRADEMARK OFFICE
CERTIFICATE OF CORRECTION

PATENT NO. : 6,982,133 B2
APPLICATION NO. : 10/327599
DATED : January 3, 2006
INVENTOR(S) : Chandhok et al.

It is certified that error appears in the above-identified patent and that said Letters Patent is hereby corrected as shown below:

Column 2
Line 51, "...diamond 18..." should read --...diamond coating 18...--.
Line 52, "....reticle 10." should read --...EUV reticle 10.--.

Column 5
Line 26, "14. ...claim 1,..." should read --14. ...claim 11,...--.

Column 6
Lines 22-23, "20. ...claim 19, comprising:" should read --20. ...claim 19, further comprising:...--.

Signed and Sealed this

Twentieth Day of March, 2007

JON W. DUDAS
*Director of the United States Patent and Trademark Office*